(12) United States Patent
Weng et al.

(10) Patent No.: US 8,143,090 B2
(45) Date of Patent: Mar. 27, 2012

(54) METHOD OF FABRICATING PHOTO SENSOR

(75) Inventors: Chien-Sen Weng, Hsin-Chu (TW);
Chih-Wei Chao, Hsin-Chu (TW);
Chrong-Jung Lin, Hsinchu (TW);
Ya-Chin King, Taipei (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/045,512

(22) Filed: Mar. 10, 2011

(65) Prior Publication Data

US 2011/0165727 A1  Jul. 7, 2011

Related U.S. Application Data

(62) Division of application No. 12/254,841, filed on Oct. 21, 2008, now Pat. No. 7,952,159.

(30) Foreign Application Priority Data

Oct. 23, 2007  (TW) ............................... 96139656 A

(51) Int. Cl.
*H01L 31/18* (2006.01)
(52) U.S. Cl. ............ 438/98; 257/458; 257/292; 257/72; 257/E31.126
(58) Field of Classification Search ............... 257/59, 257/72, 233, 290, 291, 292, 431, 434, 435, 257/458, E31.097, E33.076, E31.11, E31.121, 257/E31.122, E31.126, E31.061, E29.336; 438/98
See application file for complete search history.

(56) References Cited

U.S. PATENT DOCUMENTS

| | | | | |
|---|---|---|---|---|
| 5,936,261 A * | 8/1999 | Ma et al. | ......................... | 257/59 |
| 6,229,192 B1 * | 5/2001 | Gu | ................................ | 257/458 |
| 6,489,631 B2 * | 12/2002 | Young et al. | ..................... | 257/59 |
| 6,738,031 B2 * | 5/2004 | Young et al. | ..................... | 345/55 |
| 7,205,641 B2 | 4/2007 | Shiu | | |
| 7,242,145 B2 * | 7/2007 | Young | ........................ | 315/169.3 |
| 7,479,416 B2 * | 1/2009 | Park et al. | ..................... | 438/149 |
| 7,514,762 B2 * | 4/2009 | Deane | ........................... | 257/538 |
| 7,615,731 B2 | 11/2009 | Heiler | | |
| 7,645,646 B2 * | 1/2010 | Young | ........................... | 438/145 |
| 7,745,857 B2 * | 6/2010 | Okumura et al. | ............ | 257/292 |
| 7,872,288 B2 * | 1/2011 | Yang et al. | .................... | 257/292 |
| 8,013,955 B2 * | 9/2011 | Katoh et al. | .................... | 349/106 |
| 2007/0072326 A1 * | 3/2007 | Zheng et al. | .................... | 438/48 |
| 2007/0093007 A1 * | 4/2007 | Deane | ........................... | 438/154 |
| 2007/0205420 A1 * | 9/2007 | Ponjee et al. | .................. | 257/80 |
| 2008/0185596 A1 * | 8/2008 | Tseng et al. | .................... | 257/84 |
| 2009/0135115 A1 * | 5/2009 | Sakamoto et al. | ............. | 345/84 |

* cited by examiner

*Primary Examiner* — Ha Tran T Nguyen
*Assistant Examiner* — Jordan Klein
(74) *Attorney, Agent, or Firm* — Winston Hsu; Scott Margo

(57) ABSTRACT

A method of fabricating a photo sensor includes the following steps. First, a substrate is provided, having a conductive layer, a buffer dielectric layer, a patterned semiconductor layer, a dielectric layer, and a planarization layer disposed thereon from bottom to top, wherein the patterned semiconductor layer comprises a first doped region, an intrinsic region, and a second doped region disposed in order. Then, the planarization layer is patterned to form an opening in the planarization layer to expose a portion of the dielectric layer, wherein the opening is positioned on the intrinsic region and portions of the first and the second doped regions. Thereafter, at least a patterned transparent conductive layer is formed in the opening, covering the boundary of the intrinsic region and the first doped region and the boundary of the intrinsic region and the second doped region.

12 Claims, 15 Drawing Sheets

METHOD OF FABRICATING PHOTO SENSOR

CROSS REFERENCE TO RELATED APPLICATIONS

This application is a divisional of application Ser. No. 12/254,841 filed Oct. 21, 2008, now allowed, which claims the benefit of Taiwan Patent Application No. 096139656 filed on Oct. 23, 2007.

BACKGROUND OF THE INVENTION

1. Field of the Invention

The present invention provides a photo sensor, and more particularly, to a photo sensor applied to an embedded-on-glass ambient light sensor.

2. Description of the Prior Art

Flat display device has become one of the main components of mobile information products, such that the mobile information product manufactures and the display device suppliers have to continuously research on and design products with low power consumption. In order to achieve this goal, the mobile information product manufactures have designed an independent hidden-type photo sensor in the current circuit of product for sensing the intensity of ambient light of the display to finely adjust the brightness of the backlight of the display device, such as a liquid crystal display (LCD), by a program set in the information product, in order to save the power of the display device. However, the independent photo sensor disposed out of the display device has a disadvantage of large volume and poor accuracy of sensing result of the ambient light of the display device.

Currently, display device manufacturers also research on an embedded-on-glass ambient light sensor whose photo sensor is directly disposed on a glass substrate of the display device by adopting the low temperature polysilicon (LTPS) technique for replacing the conventional extra independent photo sensor and further saving the cost and total volume of the information products. Moreover, because the distance between the photo sensor and the LCD screen is very small (less than about 0.4 micrometers), the strength of ambient light can be accurately detected and the detecting photo current can be transformed into a steady output signal directly on the glass so as to adjust the backlight brightness according to various environments. As a result, the power of the battery of the end-product can be saved, and a better performance of the display image is supplied.

Referring to FIG. 1, FIG. 1 is a sectional-view of a photo sensor according to the conventional embedded-on-glass ambient light sensor technology. The conventional photo sensor 10 is disposed on the glass substrate 12, having a patterned shielding layer 14, a buffer oxide layer 16, a patterned semiconductor layer 18, a dielectric layer 20, and a planarization layer 22 from bottom to top. The patterned semiconductor layer 18 comprises a P-type doped region 24, an intrinsic region 26, and an N-type doped region 28 as an PIN diode, wherein the P-type doped region 24 and the N-type doped region 28 are respectively electrically connected to the corresponding contact elements 32 positioned above the dielectric layer 20 through the connection elements 30. When light illuminates the photo sensor 10, the intrinsic region 26 will be excited to form electron-hole pairs, resulting in photocurrent that can be outputted through the contact elements 32.

The sensitivity of the conventional photo sensor 10 can be obtained by measuring the photo current and the dark current, wherein the photo current represents the photocurrent formed under an illumination of ambient light, and the dark current represents the backflow current of the conventional photo sensor 10 under no illumination. The sensitivity is defined as the ratio of the photo current to the dark current. According to the measurement result of the conventional photo sensor 10, the ratio of the photo current to the dark current is far less than 100, thus the sensitivity of the conventional photo sensor 10 is not high enough when it is applied to information products. Accordingly, the variation or change of ambient light cannot be effectively detected by the conventional photo sensor 10, which looses the function of providing data for finely adjusting the backlight of the display device.

As mentioned above, the technology of current embedded-on-glass ambient light sensor still has the problem of poor sensitivity, so that it has limited performance when applying to mobile information products practically. As a result, the manufacturers still have to continuously research and develop photo sensors with high sensitivities.

SUMMARY OF THE INVENTION

It is therefore a primary objective of the claimed invention to provide a photo sensor with a patterned transparent conductive layer used for reducing dark current and improving the sensitivity of the photo sensor.

According to the claimed invention, a photo sensor is provided, wherein the photo sensor comprises a patterned shielding conductive layer disposed on a transparent substrate; a buffer dielectric layer disposed on the patterned shielding conductive layer; a patterned semiconductor layer disposed on the buffer dielectric layer, wherein the patterned semiconductor layer comprises an intrinsic region and a first doped region and a second doped region positioned at two sides of the intrinsic region; a dielectric layer disposed on the patterned semiconductor layer; and a patterned transparent conductive layer positioned on the dielectric layer, covering the boundary of the intrinsic region and the first doped region and the boundary of the intrinsic region and the second doped region of the patterned semiconductor layer, wherein the patterned transparent conductive layer is electrically connected to the patterned shielding conductive layer.

According to the claimed invention, a method of fabricating a photo sensor is further provided. First, a substrate is provided, having a conductive layer, a buffer dielectric layer, a patterned semiconductor layer, a dielectric layer, and a planarization layer disposed thereon from bottom to top, wherein the patterned semiconductor layer comprises a first doped region, an intrinsic region, and a second doped region disposed in order. Then, the planarization layer is patterned to form an opening in the planarization layer to expose a portion of the dielectric layer, wherein the opening is positioned on the intrinsic region and portions of the first and the second doped regions. Thereafter, at least a patterned transparent conductive layer is formed in the opening, covering the boundary of the intrinsic region and the first doped region and the boundary of the intrinsic region and the second doped region.

It is an advantage of the claimed invention that the photo sensor has a patterned transparent conductive layer covering the boundary of the intrinsic region and the first doped region and the boundary of the intrinsic region and the second doped region, such that voltage can be supplied to the patterned transparent conductive layer in order to change the electric field near the patterned semiconductor layer for inhibiting dark current of the photo sensor, further improving its sensitivity and operation performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
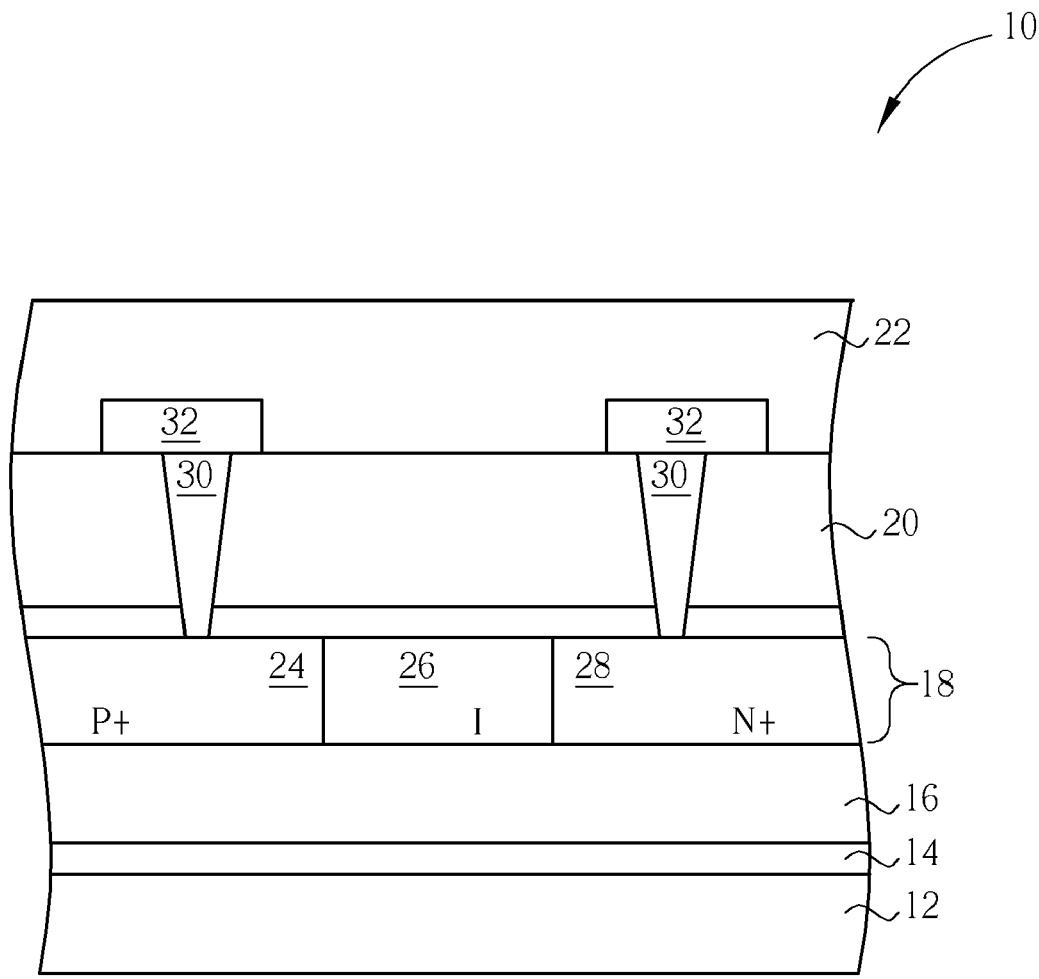
FIG. 1 is a sectional view of a conventional photo sensor.
Figure 2:
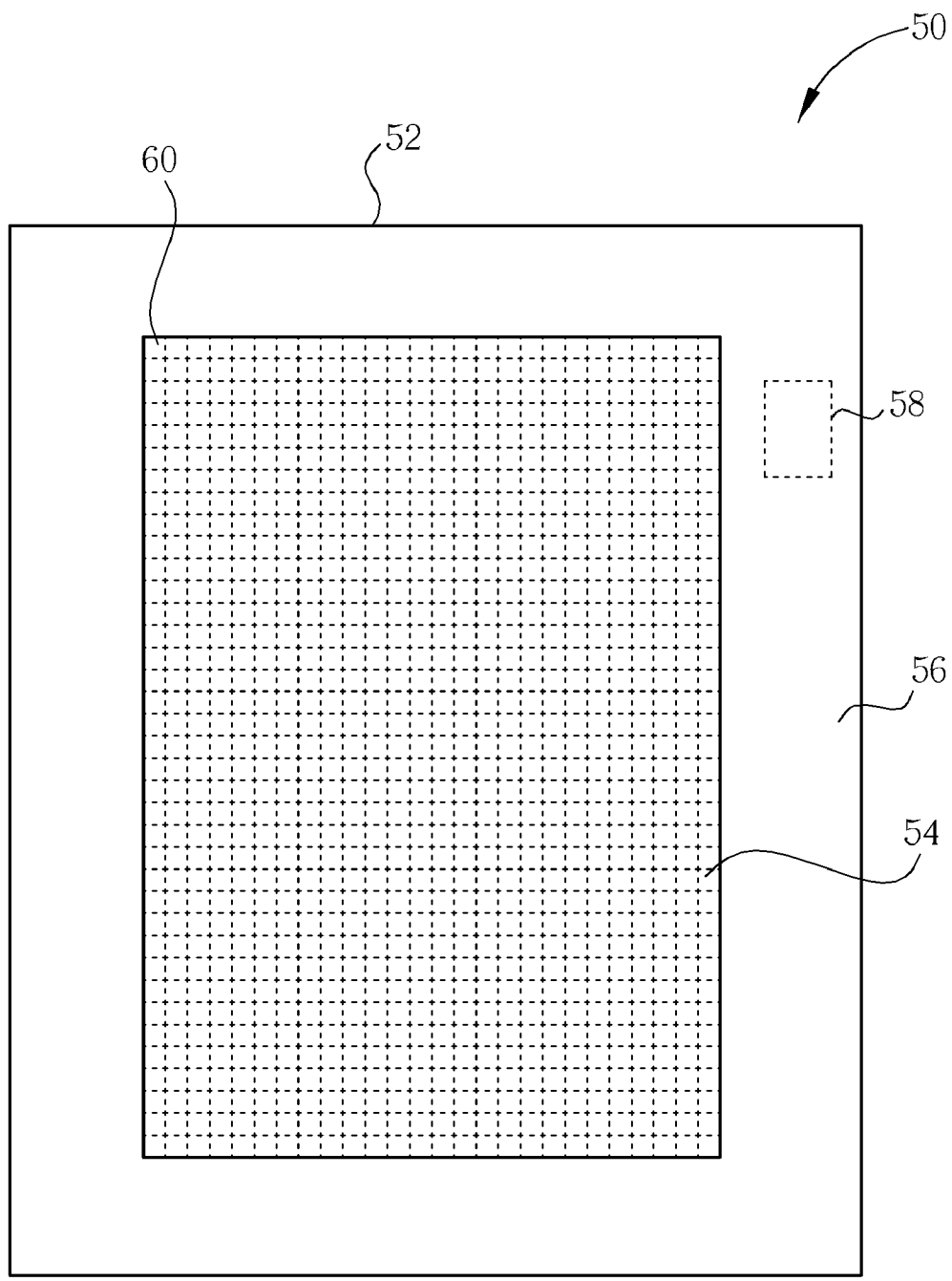
FIG. 2 is a schematic diagram of a flat display panel according to the present invention.

With reference to FIG. 2, FIG. 2 is a schematic diagram of a flat display panel according to the present invention, wherein the present invention photo sensor is disposed thereon. The flat display panel 50 of the present invention comprises at least a transparent substrate 52 with a display area 54 and a periphery area 56, and the flat display panel 50 comprises a display component disposed on the transparent substrate 52 in the display area 54. The display component has a plurality of pixels 60 arranged as a matrix in the display area 54. In addition, the flat display panel 50 further comprises at least an embedded-on-glass photo sensor 58 disposed in the periphery area 56 for real-time detecting the intensity of ambient light around the flat display panel 50.

Figure 3:
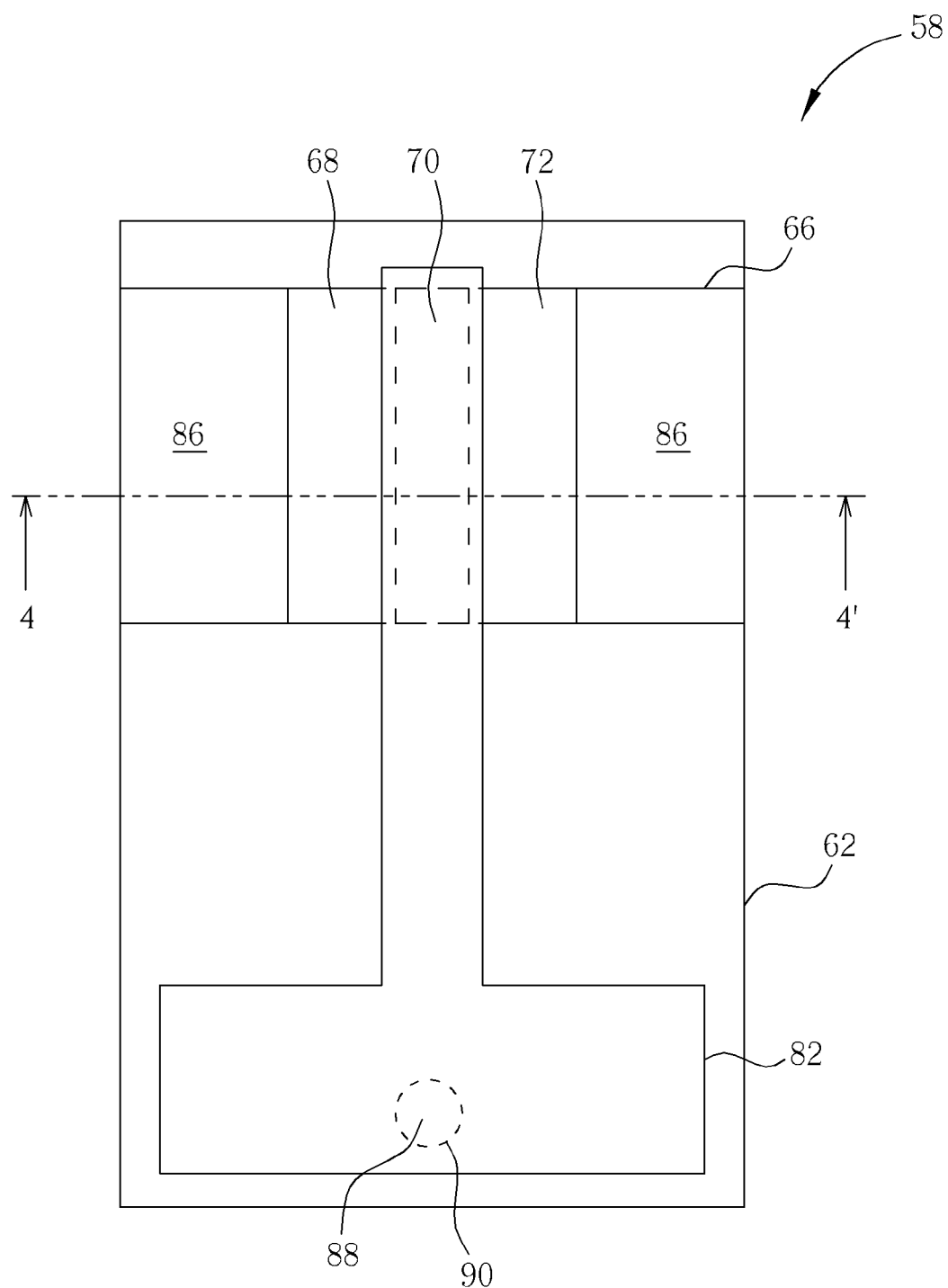
FIG. 3 is a top view of a photo sensor according to a first embodiment of the present invention.
Figure 4:
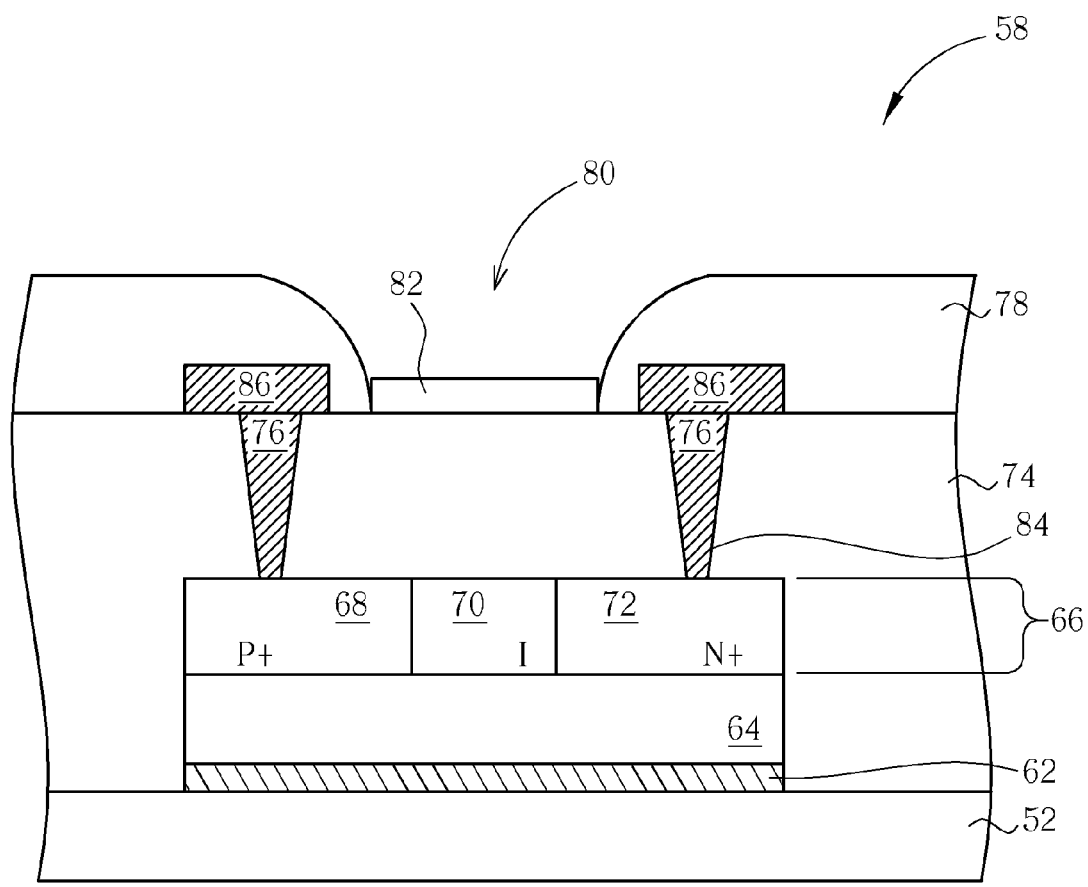
FIG. 4 is a sectional view of the photo sensor shown in FIG. 3 along line 4-4'.

Referring to FIGS. 3-4, FIG. 3 is a top view of the photo sensor 58 according to a first embodiment of the present invention, while FIG. 4 is a sectional view of FIG. 3 along line 4-4'. The photo sensor 58 comprises a patterned shielding conductive layer 62 disposed on the transparent substrate 52, a buffer dielectric layer 64 disposed on the patterned shielding conductive layer 62, and a patterned semiconductor layer 66 disposed on the buffer dielectric layer 64. The photo sensor 58 further comprises a dielectric layer 74 disposed on the transparent substrate 54, covering the patterned semiconductor layer 66. The patterned shielding conductive layer 62 preferably comprises metal materials, such as molybdenum (Mo); the buffer dielectric layer 64 may comprise an oxide layer, such as a silicon oxide layer; and the dielectric layer 74 may comprise a nitride layer. The patterned semiconductor layer 66 comprises an intrinsic region 70 and a first doped region 68 and a second doped region 72 positioned at two sides of the intrinsic region 70. In this embodiment, the first doped region 68 and the second doped region 72 can be a P-type doped region and an N-type doped region respectively, or such as P+ doped region and N+ doped region respectively. Therefore, the patterned semiconductor layer 66 forms a PIN diode. However, the first and the second doped regions 68, 72 are not limited to the conductive type disclosed in this embodiment, and may be P-type doped region or N-type doped region respectively. In other words, the patterned semiconductor layer 66 may be an NIN diode, a PIP diode, or an NIP diode.

The present invention photo sensor 58 further comprises at least two connection elements 76 disposed in the via holes 84 and at least two contact elements 86 disposed on the surface of the dielectric layer 74, wherein the two contact elements 86 are electrically connected to the first doped region 68 and the second doped region 72 through the connection elements 76 respectively. In addition, the photo sensor 58 further comprises a planarization layer 78 and a patterned transparent conductive layer 82 disposed on the dielectric layer 74. The planarization layer 78 is preferably made of photoresist or organic materials. The planarization layer 78 has an opening 80, positioned on the intrinsic region 70, a portion of the first doped region 68, and a portion of the second doped region 72. On the other hand, a portion of the patterned transparent conductive layer 82 is disposed in the opening 80, on the surface of the dielectric layer 74. The material of the patterned transparent conductive layer 82 may comprise indium tin oxide (ITO) or indium zinc oxide (IZO).

The patterned semiconductor layer 66 serves as the photo-sensing area of the photo sensor 58 and will produce electron-hole pairs to form photocurrents in the intrinsic region 70, when it is under illumination, which will be transferred to an external circuit through the contact elements 86. An example of the external circuit may be the control circuit of the flat display panel 50 such that the brightness of the backlight of the flat display panel 50 can be tuned accordingly.

With reference to FIG. 3, the photo sensor 58 further comprises a connection element 88 disposed out of the photo-sensing area. The connection element 88 is disposed in the via hole 90 which is through the dielectric layer 74 for electrically connecting the patterned transparent conductive layer 82 and the patterned shielding conductive layer 62. As a result, when the photo sensor 58 is under operation, the patterned shielding conductive layer 62 may be supplied with a voltage so that the patterned transparent conductive layer 82 has the same voltage. On the other side, since the patterned transparent conductive layer 82 is disposed in the opening 80, it completely covers the intrinsic region 70, a portion of the first doped region 68, and a portion of the second doped region 72, which means the patterned transparent conductive layer 82 also covers the boundary of the intrinsic region 70 and the first doped region 68 and the boundary of the intrinsic region 70 and the second doped region 72. Accordingly, the patterned transparent conductive layer 82 with a specific voltage covers the depletion region formed around the boundaries of the intrinsic region 70 with the first and the second doped regions 68, 72, thus the dark current occurring in the depletion region can be reduced.

Figure 5:
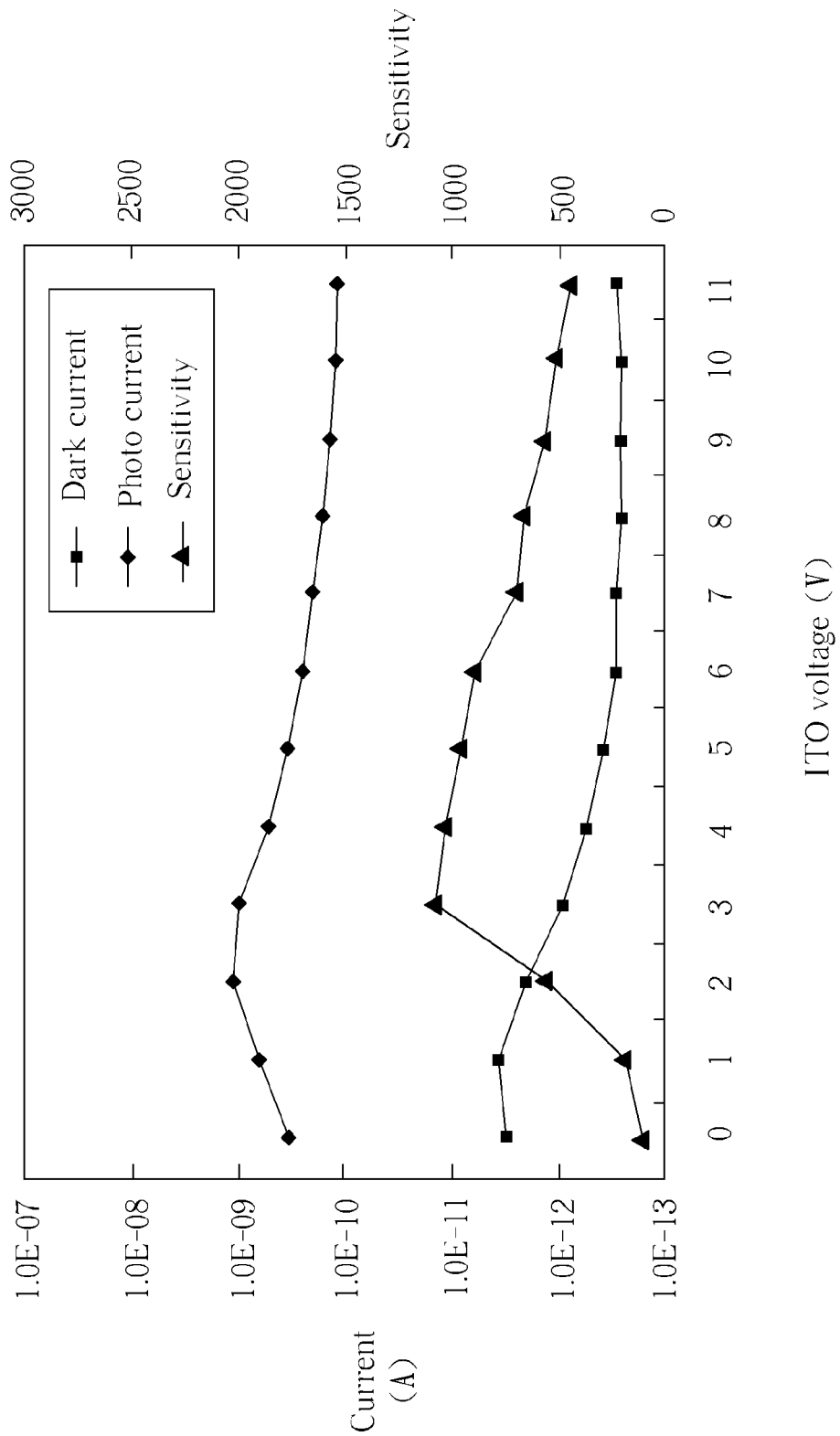
FIG. 5 is a curve chart optic-electrics characteristics of the photo sensor of the present invention.

Referring to FIG. 5, FIG. 5 is a curve chart of the optic-electrics characteristics of the present invention photo sensor 58. As the variation of the voltage applied on the patterned transparent conductive layer 82, the magnitude of the dark current is apparently affected. As shown in FIG. 5, when the applied voltage of the patterned transparent conductive layer 82 is about 3 to 4 volts, the photo sensor 58 has a preferable sensitivity. In contrast to the situation of the applied voltage of the patterned transparent conductive layer 82 being 0 volt or the conventional photo sensor, when the patterned transparent conductive layer 82 of the present invention photo sensor 58 is supplied with a specific voltage, the sensitivity can be raised about 2.5 to 9.4 times such that the problem of poor sensitivity of the conventional embedded-on-glass ambient light sensing technology is effectively solved.

Figure 6:
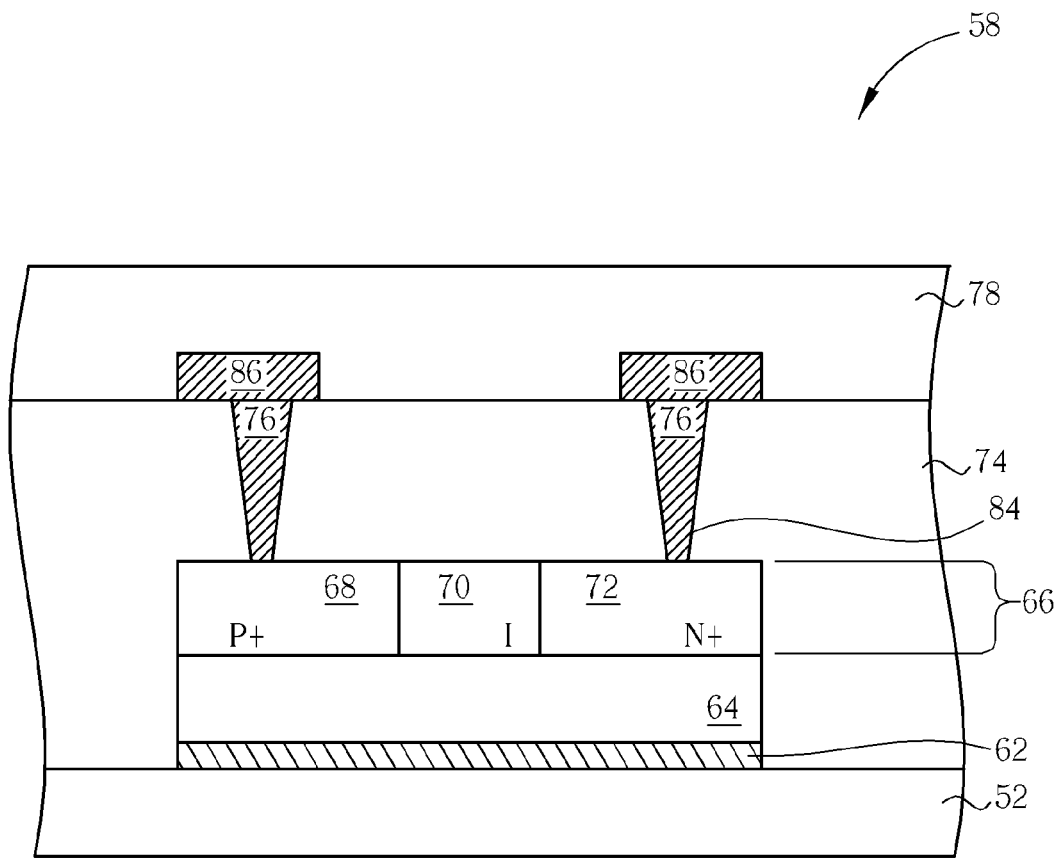
FIG. 6 to FIG. 7 are schematic diagrams of the fabrication processes of the photo sensor shown in FIG. 4.
Figure 7:
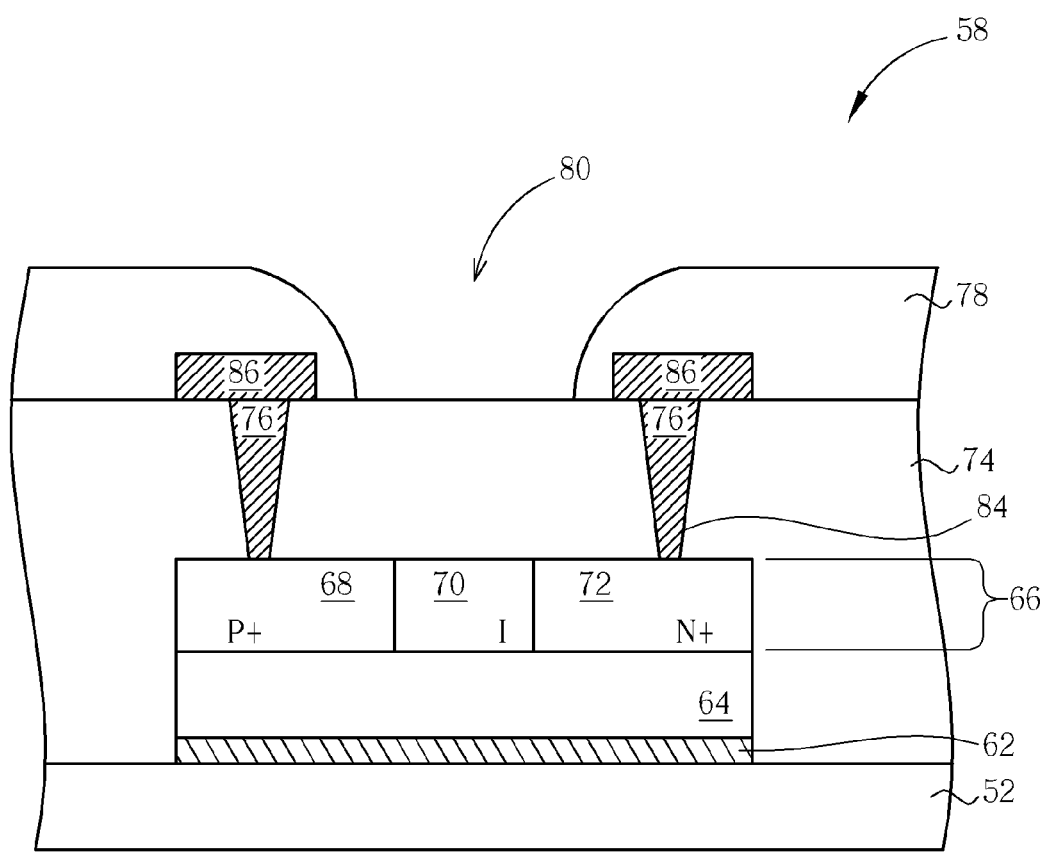

The fabrication method of the present invention photo sensor 58 is illustrated in FIGS. 6-7. First, as shown in FIG. 6, the transparent substrate 52 is provided, wherein the patterned shielding conductive layer 62, the buffer dielectric layer 64, the patterned semiconductor layer 66, the dielectric layer 74, a plurality of connection elements 76, a plurality of contact elements 86, and the planarization layer 78 are disposed on the transparent substrate 52 from bottom to top. The patterned semiconductor layer 66 has the first doped region 68, the intrinsic region 70, and the second doped region 72 positioned from left to right in order, and the planarization layer 78 preferably can be made of photoresist materials. Thereafter, as shown in FIG. 7, an exposure process and a development process are sequentially performed to remove a portion of the planarization layer 78 so as to form an opening 80 to expose a portion of the dielectric layer 74, wherein the opening 80 is positioned above the intrinsic region 70 and portions of first and the second doped regions 68, 72. Then, referring to FIG. 4, at least a patterned transparent conductive layer 82 is formed in the opening 80 to finish the manufacturing of the present invention photo sensor 58. It should be noted that since the patterned transparent conductive layer 82 has to be electrically connected to the patterned shielding conductive layer 62 through the connection element 88 shown in FIG. 3, the connection element 88 may be fabricated spontaneously with the connection elements 76 disposed above the first and second doped regions 68, 72.

Figure 8:
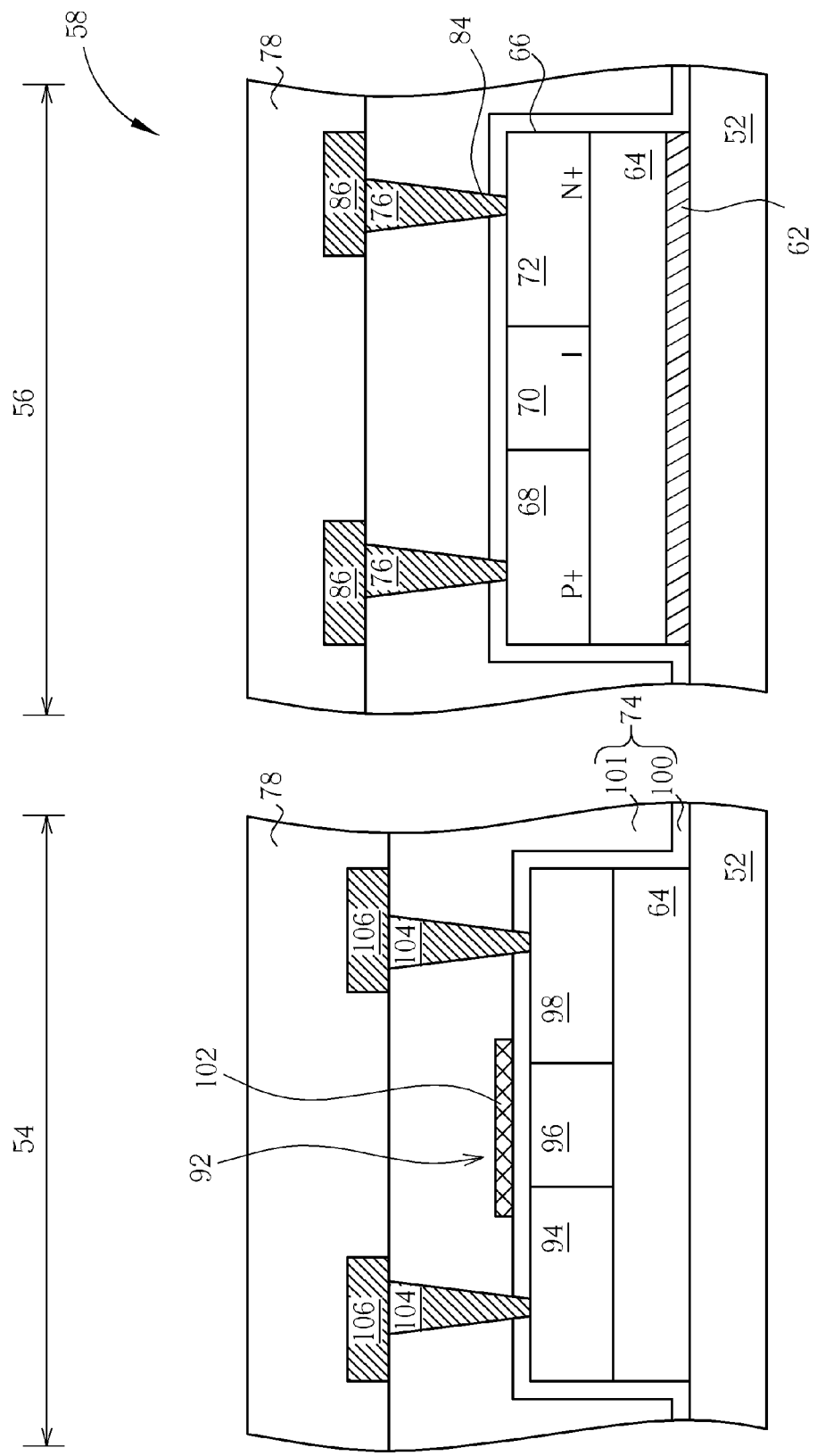
FIG. 8 to FIG. 10 are schematic diagrams of the fabrication processes of a photo sensor according to a second embodiment of the present invention.
Figure 9:
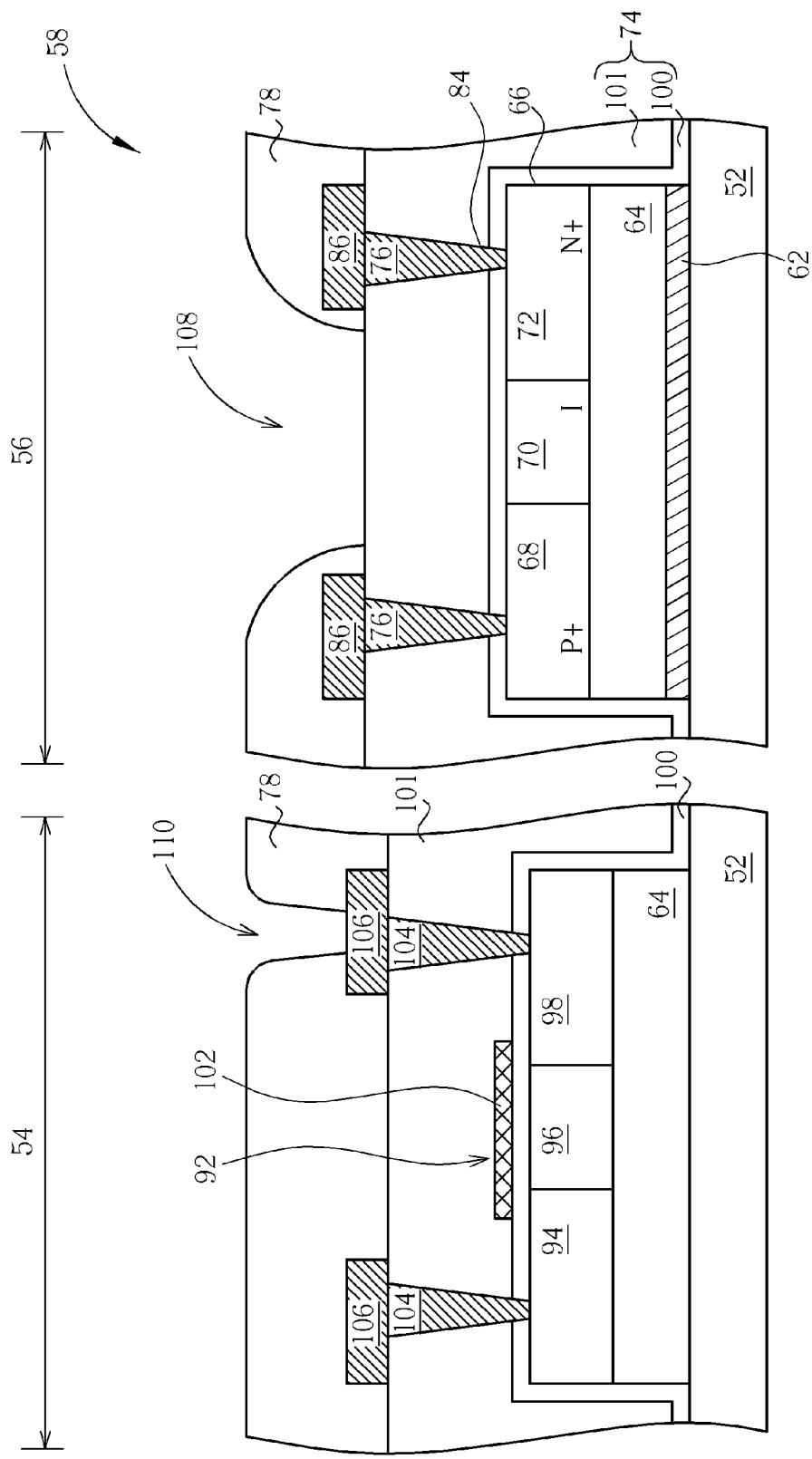
Figure 10:
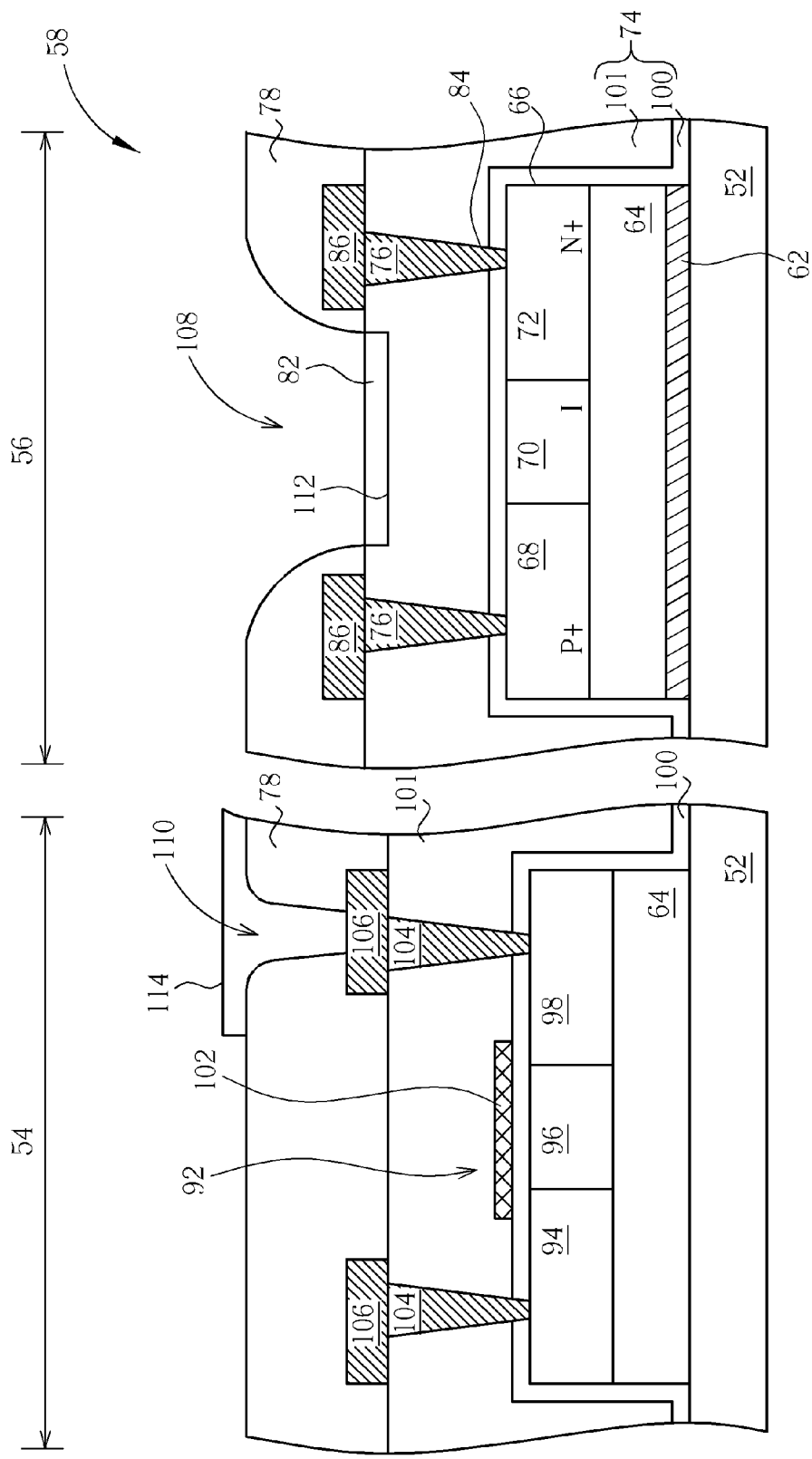

Process diagrams of the manufacturing method of a second embodiment of the present invention photo sensor are shown in FIGS. 8-10, wherein the same elements of the second and first embodiments are represented with the same numerals as used in FIGS. 3-4. First, as shown in FIG. 8, a transparent substrate 52 is provided, which has a display area 54 and a periphery area 56 thereon. The display area 54 comprises a plurality of pixels (not shown), each of which has a thin film transistor 92. In addition, a present invention photo sensor 58 is predetermined to be disposed in the periphery area 56. The transparent substrate 52 has a buffer dielectric layer 64, a patterned semiconductor layer 66, a dielectric layer 74, and a planarization layer 78 disposed thereon from bottom to top, and a patterned shielding conductive layer 62 is further disposed below the buffer dielectric layer 64 in the periphery area 56. The thin film transistor 92 comprises a source 94 and a drain 98 disposed at two sides of the channel region 96, and further comprises a gate 102 and a gate insulating layer 100 disposed between the gate 102 and the channel region 96. The gate 102 is preferably made of metal materials, and the source 94 and the drain 98 may be made of doped polysilicon materials, such as materials in the N+ doped region or P+ doped region. Moreover, the dielectric layer 74 includes an interlayer dielectric (ILD) layer 101 disposed on the gate insulating layer 100 and the gate 102, while the source 94 and the drain 98 are electrically connected to the upper contact elements 106 through the connection elements 104 in the ILD layer 101.

Then, referring to FIG. 9, an exposure process and a development process are sequentially performed to pattern the planarization layer 78, so as to form a first opening 108 in the planarization layer 78 above the intrinsic region 70 and portions of the first doped region 68 and the second doped region 72 and a second opening 110 in the planarization layer 78 above the drain 98. The first opening 108 exposes the ILD layer 101 positioned on the intrinsic region 70 and portions of the first and second doped regions 68, 72, and the second opening 110 exposes a portion of the contact element 106 of the drain 98. Referring to FIG. 10, an etching process is performed by taking the planarization layer 78 as an etching mask to remove a portion of the ILD layer 101 exposed by the first opening 108 to form a via opening 112 in the ILD layer 101, wherein the bottom of the via opening 112 exposes a portion of the ILD layer 101. Thereafter, a transparent conductive is formed to fill the first opening 108 to fabricate the patterned transparent conductive layer 82 in the via opening 112 covering the intrinsic region 70 and portions of the first and the second doped regions 68, 72. Sequentially, portions of the transparent conductive layer in the display area 54 may be selectively removed to form a pixel electrode 114 in each pixel, which is electrically connected to the contact element 106 and the drain 98. Therefore, the pixel electrode 114 and the patterned transparent conductive layer 82 may be fabricated with the same materials or through the same transparent conductive layer.

It should be noted that the depth of the via opening 112 may be varied according to different photo sensors 58. One of the main spirits of the present invention is to provide a specific voltage to the patterned transparent conductive layer 82 when the photo sensor 58 is detecting light for changing the electric field of the photo-sensing area to inhibit the dark current. Accordingly, the distance between the patterned transparent conductive layer 82 and the patterned semiconductor layer 66 influences the performance of the photo sensor 58. As a result, the depth of the via opening 112 may be enlarged for disposing the patterned transparent conductive layer 82 into various positions in the dielectric layer 74 according to the practical design requirement, such that the patterned transparent conductive layer 82 and the patterned semiconductor layer 66 may have a preferable and appropriate spacing. For example, the patterned transparent conductive layer 82 can be deposed on the surface of the gate insulating layer 100 so as to have a small distance with the patterned semiconductor layer 66.

In addition, when patterning the planarization layer 78, an via-hole pattern (not shown) of the via hole 90 shown in FIG. 3 may be also defined on the planarization layer 78 out of the photo-sensing area spontaneously. Then, portions of the ILD layer 101 and the gate insulating layer 100 are removed through a following etching process to form the via hole 90, exposing a portion of the patterned shielding conductive layer 62 such that the sequentially formed transparent conductive layer can fill the via hole 90, forming the connection element 88 for electrically connecting the patterned transparent conductive layer 82 and the patterned shielding conductive layer 62. Moreover, since the depths of the via opening 112 and the via hole 90 may be different, the patterning process of the planarization layer 78 may be performed through a half-tone mask for defining the patterns of the via opening 112 and the via hole 90.

Figure 11:
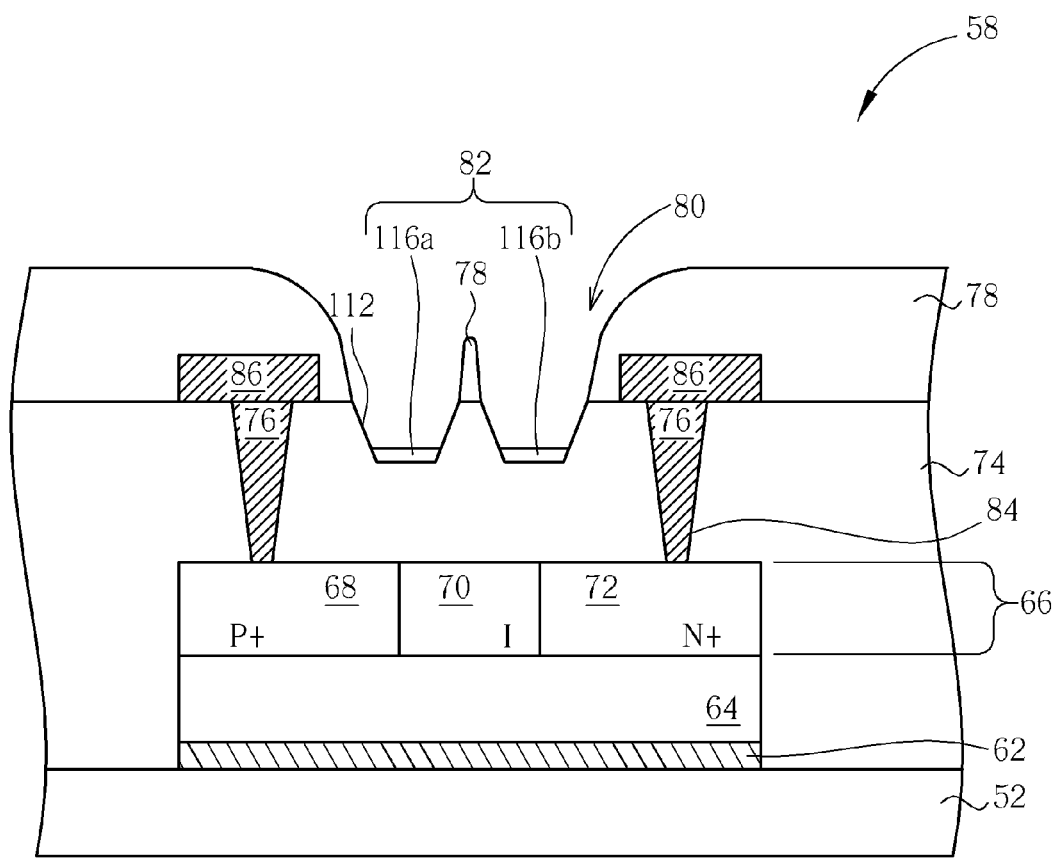
FIG. 11 is a sectional view of a photo sensor according to a third embodiment of the present invention.

FIG. 11 is a sectional view of a photo sensor according to a third embodiment of the present invention, wherein numerals are used for representing the same elements as shown in FIG. 4. In this embodiment, the photo sensor 58 includes two via openings 112 disposed in the dielectric layer 74, and portions of the patterned transparent conductive layer 82 are disposed in each via opening 112 to form a first transparent electrode 116a and a second transparent electrode 116b, both of which are electrically connected to the patterned shielding conductive layer 62. The first transparent electrode 116a covers the boundary of the intrinsic region 70 and the first doped region 68, and the second transparent electrode 116b covers the boundary of the intrinsic region 70 and the second doped region 72. As a result, the depletion region of the patterned semiconductor layer 66 is covered by the first and second transparent electrodes 116a, 116b for inhibiting dark current.

The fabrication process of this embodiment may comprise the following steps: After the planarization layer 78 is formed on the transparent substrate 52, an expose and a development processes is performed to pattern that planarization layer 78 to form the pattern of the transparent conductive layer 82 (the pattern corresponding to the two via openings 112, not shown) with the opening 80 in the planarization layer 78. Then, a second etching process is performed to remove a portion of the dielectric layer 74 through the opening 80 so as to form two via openings 112. Sequentially, the patterned transparent conductive layer 82 is formed in the via openings 112 through the process mentioned in the above embodiments to cover portions of the intrinsic region 70, the first doped region 68, and the second doped region 72.

Figure 12:
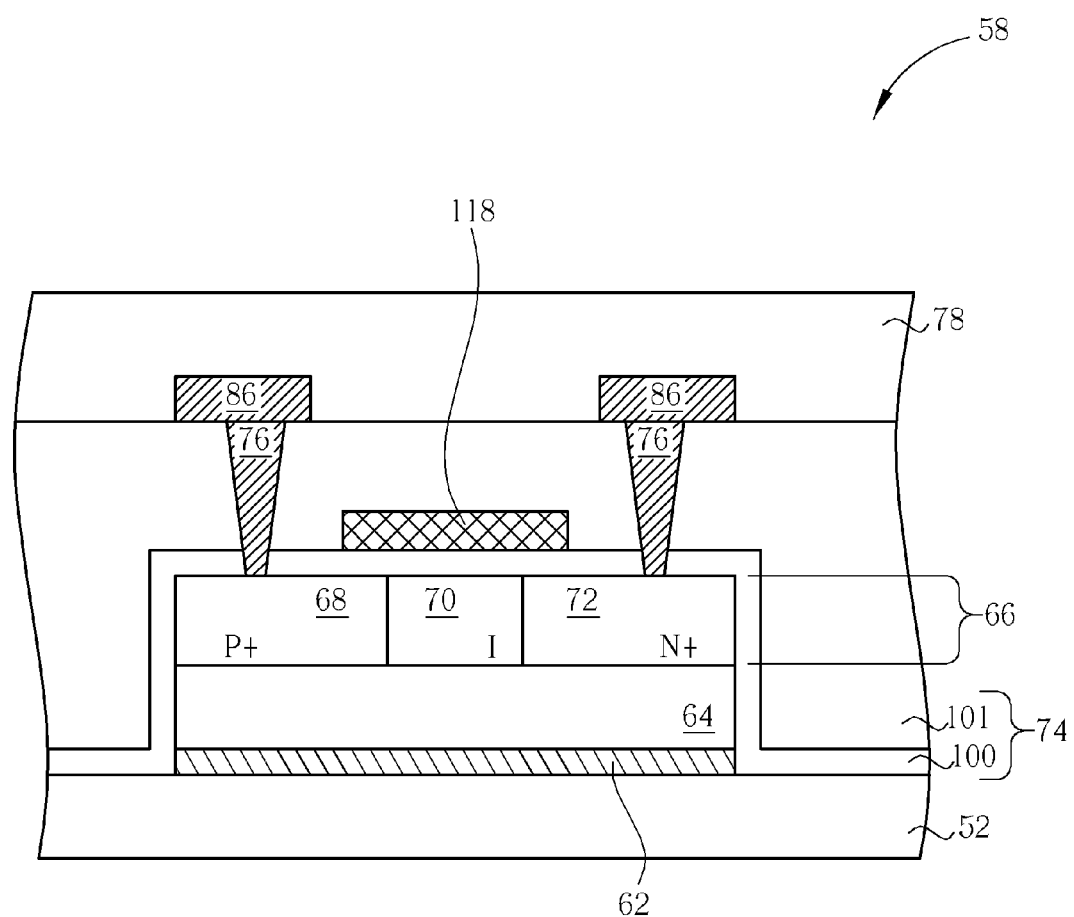
FIG. 12 to FIG. 14 are schematic diagrams of the fabrication processes of a photo sensor according to a fourth embodiment of the present invention.
Figure 13:
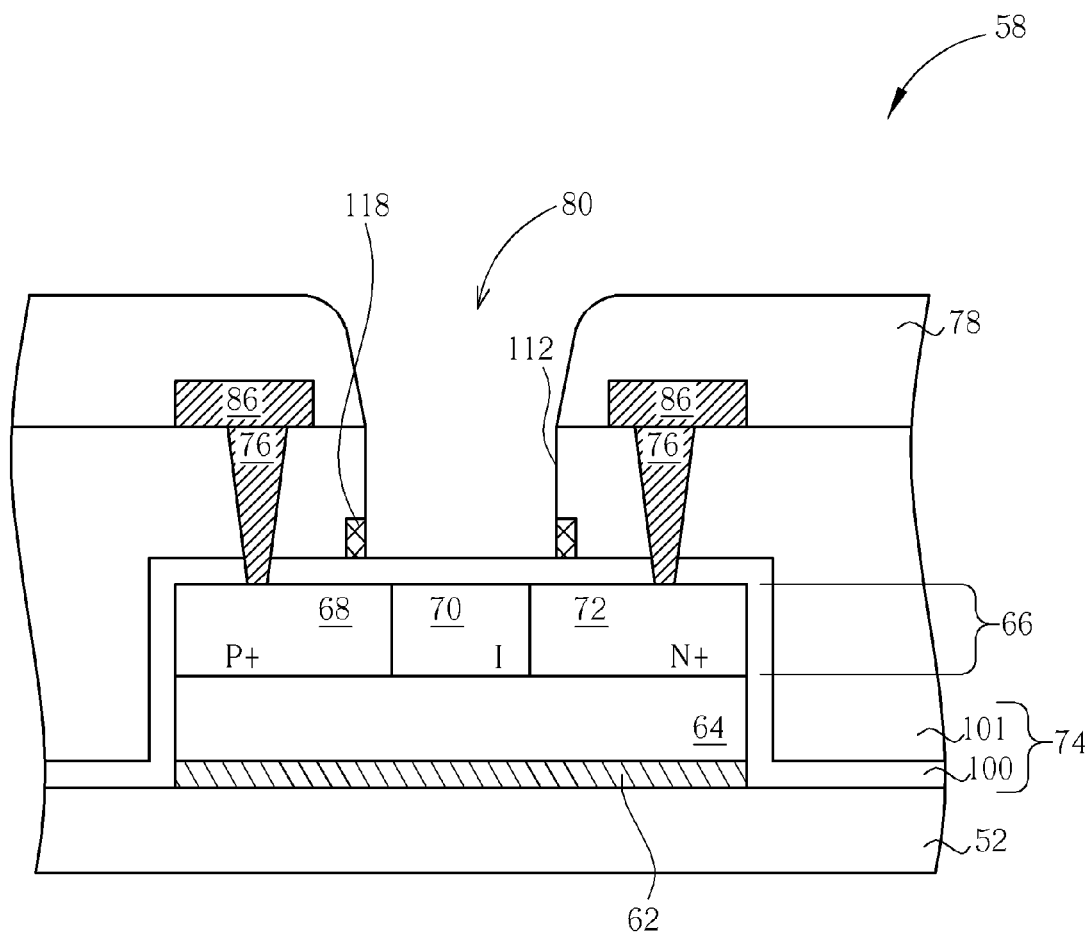
Figure 14:
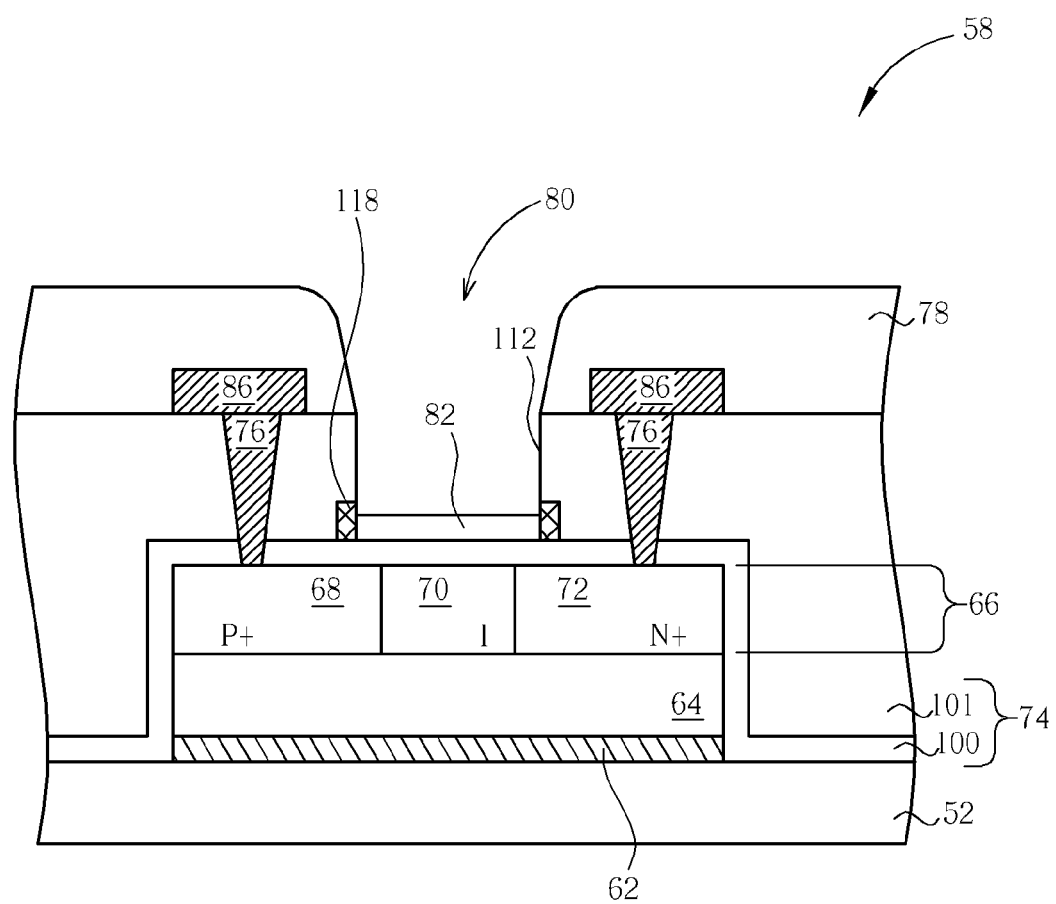

FIGS. 12-14 are sectional views of the fabricating process of the photo sensor according to a fourth embodiment of the present invention with the same numerals for representing same elements which has been shown in FIG. 4. In this embodiment, the photo sensor 58 is manufactured in cooperation with the fabrication of the thin film transistor 91 while no extra mask is used for forming the source 94 and the drain 98 (shown in FIG. 10). As shown in FIG. 12, first, the transparent substrate 52 is provided, which includes a display area and a periphery area. The transparent substrate 52 has a buffer dielectric layer 64, a patterned semiconductor layer 66, and a patterned shielding conductive layer 62 positioned in the periphery area. Then, a mask is used to cover the predetermined channel region of the thin film transistor in the display area and the predetermined intrinsic region of the photo sensor 58, and at least a first ion implantation process is performed to form the heavy-doped source and drain of the thin film transistor and the first doped region 68 and the second doped region 72 of the photo sensor 58. The portion of the patterned semiconductor layer 66 of the photo sensor 58 not be implanted is defined as the intrinsic region 70, positioned between the first doped region 68 and the second doped region 72. Thereafter, the above-mentioned mask is removed, and a gate insulating layer 100 and a patterned metal layer are sequentially formed on the surface of the transparent substrate 52, wherein the patterned metal layer serves as the gate of the thin film transistor in the display area (as the gate 102 shown in FIG. 10), and also serve as a doping mask layer 118 of the photo sensor 58 to completely cover the intrinsic region 70. Then, a second light ion implantation process is performed to form lightly doped drains (LDDs) of the thin film transistor. During this process, the doping mask layer 118 is used for preventing the intrinsic region 70 from being implanted by the second ion implantation process to lose the characteristic of an intrinsic region. Therefore, the pattern of the doping mask layer 118 has to be larger than that of the intrinsic region 70, as shown in FIG. 12. After the LDDs are formed, the ILD layer 101, the connection elements 76, the contact elements 86, and the planarization layer 78 are sequentially formed on the transparent substrate 52.

With reference to FIG. 13, the planarization layer 78 is patterned to form the opening 80, which is required to expose the portion of the ILD layer 101 positioned on the intrinsic region 70 and portions of the first and second doped regions 68, 72. Then, the patterned planarization layer 78 is taking as an etching mask to perform an etching process for removing the exposed ILD layer 101 and the under doping mask layer 118 until the surface of the gate insulating layer 100 is exposed, which means this etching process is stopped on the surface of the gate insulating layer 100. As a result, the via opening 112 is formed and the intrinsic region 70 is not covered by the doping mask layer 118 anymore. Then, as shown in FIG. 14, a patterned transparent conductive layer 82 is formed in the via opening 112 to complete the fabrication process of the photo sensor 58 of the fourth embodiment of the present invention.

Figure 15:
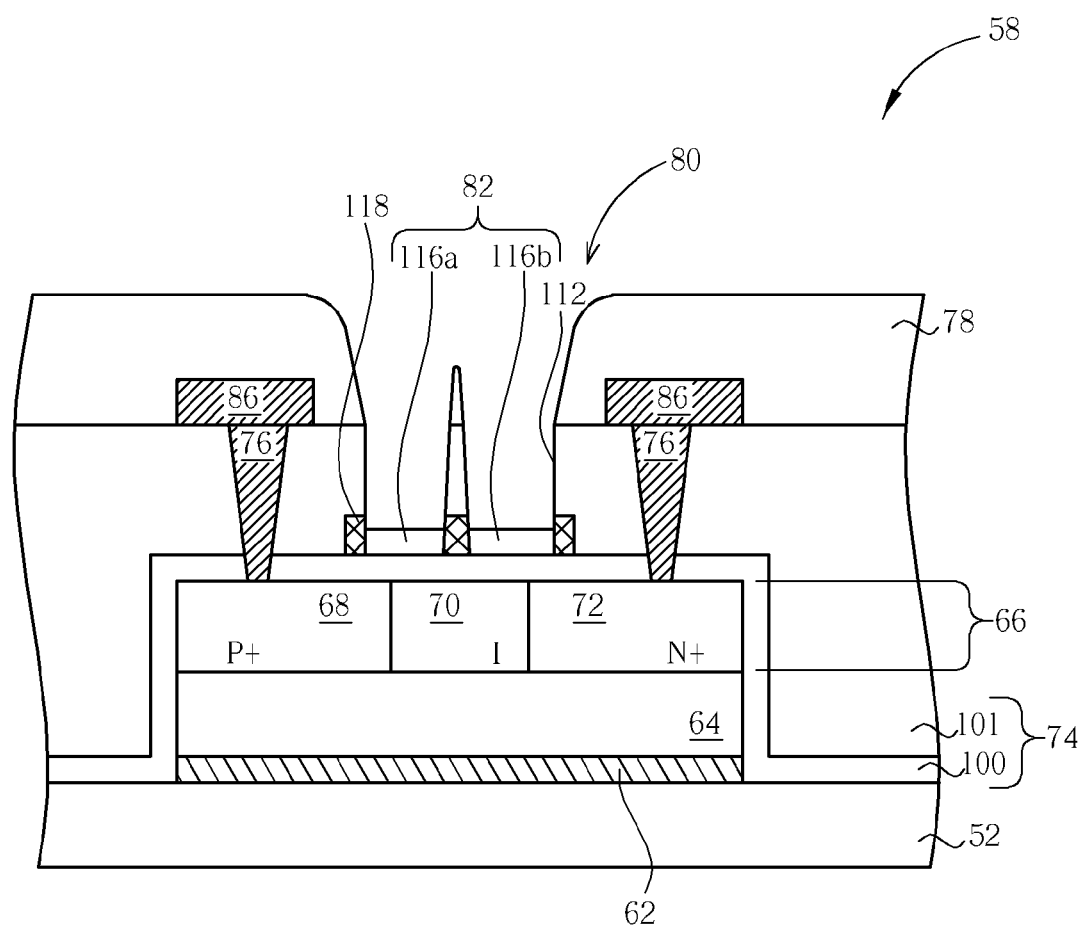
FIG. 15 is a sectional view of a photo sensor according to a fifth embodiment of the present invention.

Similarly, with the doping mask layer 118 in the photo sensor 58, the patterned transparent conductive layer 82 may also include a first transparent electrode 116a and a second transparent electrode 116b. FIG. 15 is a sectional view of the photo sensor according to a fifth embodiment of the present invention. In this embodiment, the present invention photo sensor 58 comprises a doping mask layer 118 disposed on the surface of the gate insulating layer 100 and two via openings 112 in the ILD layer 101 and the doping mask layer 118. The first transparent electrode 116a and the second transparent electrode 116b are respectively disposed in each via opening 112, covering the boundaries of the intrinsic region 70 with the first and the second doped regions 68, 72 for inhibiting dark current.

The present invention photo sensor is not limited to the above-mentioned ambient light photo sensor disposed in the periphery area of an flat display, but can be applied to the photo sensor in an image detector for sensing colorful light or image. In contrast to the prior art, a patterned transparent conductive layer electrically connected to the patterned shielding conductive layer is disposed in the embedded-on-glass photo sensor of the present invention, and the patterned transparent conductive layer covers the depletion around the boundaries of the intrinsic region and the first and second doped regions of the photo diode. By the way of applying a specific value of voltage to the patterned transparent conductive layer, the dark current of the photo diode can be reduced to effectively improve the sensitivity of the photo sensor, as well as the sensing performance of which under a low intensity of illumination. Furthermore, the present invention photo sensor is capable of manufacturing in cooperation with the conventional fabrication process of thin film transistors through simple processes, and therefore it has practical applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a photo sensor, comprising:
   providing a substrate with a conductive layer, a buffer dielectric layer, a patterned semiconductor layer, a dielectric layer, and a planarization layer stacked thereon from bottom to top, the patterned semiconductor layer comprising a first doped region, an intrinsic region, and a second doped region disposed in order;
   patterning the planarization layer to make the planarization layer have an opening that exposes a portion of the dielectric layer, the opening being disposed above the intrinsic region and portions of the first doped region and the second doped region; and
   forming at least a patterned transparent conductive layer in the opening, covering a boundary of the intrinsic region and the first doped region and a boundary of the intrinsic region and the second doped region.

2. The method of fabricating the photo sensor of claim 1, further comprising performing an etching process to remove the portion of the dielectric layer exposed by the opening so as to form a via opening in the dielectric layer before forming the patterned transparent conductive layer in the opening and the via opening.

3. The method of fabricating the photo sensor of claim 2, wherein the etching process further comprises forming a via hole in the dielectric layer, the via hole exposing a portion of the patterned shielding conductive layer, and when forming the patterned transparent conductive layer in the via opening, a transparent connection element is further formed in the via hole spontaneously so that the patterned transparent conductive layer is electrically connected to the patterned shielding conductive layer through the transparent connection element.

4. The method of fabricating the photo sensor of claim 2, wherein the substrate further comprises a doping mask layer covering the intrinsic region, and the etching process further comprises removing a portion of the doping mask layer above the intrinsic region.

5. The method of fabricating the photo sensor of claim 4, wherein the doping mask layer comprises metal materials.

6. The method of fabricating the photo sensor of claim 2, wherein the etching process forms two via opening in the dielectric layer, and the patterned transparent conductive layer comprises two transparent electrodes disposed in each of the via openings, the transparent electrodes covering the boundary of the intrinsic region and the first doped region and the boundary of the intrinsic region and the second doped region respectively.

7. The method of fabricating the photo sensor of claim 2, wherein the dielectric layer comprises a gate insulating layer and an interlayer dielectric layer.

8. The method of fabricating the photo sensor of claim 7, wherein the etching process is stopped at the interlayer dielectric layer.

9. The method of fabricating the photo sensor of claim 7, wherein the etching process is stopped on the surface of the gate insulating layer.

10. The method of fabricating the photo sensor of claim 1, wherein the patterned transparent conductive layer completely covers the intrinsic region.

11. The method of fabricating the photo sensor of claim 1, wherein the first doped region and the second doped region are a P-type doped region or an N-type doped region individually.

12. The method of fabricating the photo sensor of claim 1, wherein the substrate further comprises at least a thin film transistor, and the method comprises forming a pixel electrode electrically connected to a drain of the thin film transistor when forming the patterned transparent conductive layer spontaneously.

* * * * *